US012718894B2

(12) United States Patent
Son et al.

(10) Patent No.: US 12,718,894 B2
(45) Date of Patent: Aug. 25, 2026

(54) STORAGE APPARATUS INCLUDING WORD LINE GROUPING DEVICE AND OPERATING METHOD THEREOF

(71) Applicant: SK hynix Inc., Gyeonggi-do (KR)

(72) Inventors: Jae Yong Son, Gyeonggi-do (KR); Woo Suk Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 110 days.

(21) Appl. No.: 18/774,938

(22) Filed: Jul. 17, 2024

(65) Prior Publication Data

US 2025/0266107 A1 Aug. 21, 2025

(30) Foreign Application Priority Data

Feb. 16, 2024 (KR) ........................ 10-2024-0022408

(51) Int. Cl.
*G11C 16/34* (2006.01)
*G11C 16/08* (2006.01)
*G11C 16/26* (2006.01)

(52) U.S. Cl.
CPC .......... *G11C 16/3418* (2013.01); *G11C 16/08* (2013.01); *G11C 16/26* (2013.01)

(58) Field of Classification Search
CPC ............... G06F 11/1012; G06F 3/0659; G06F 11/0772; G06F 11/10; G06F 11/1068; G06F 11/141; G06F 3/0619; G06F 3/0679; G06F 11/076; G06F 3/0613; G06F 3/0673
See application file for complete search history.

(56) References Cited

U.S. PATENT DOCUMENTS

2015/0169468 A1* 6/2015 Camp ..................... G11C 11/56 711/207
2019/0115078 A1 4/2019 Kim et al.
2019/0279723 A1* 9/2019 Hsiao ................. G11C 11/5642
2021/0166764 A1 6/2021 Hong et al.
2025/0131969 A1 4/2025 Son et al.

FOREIGN PATENT DOCUMENTS

KR 10-2017-0065076 A 6/2017
KR 10-2023-0070606 A 5/2023

OTHER PUBLICATIONS

Extended European Search Report for European Patent Application No. 24220844.5 issued by the European Patent Office on Jul. 7, 2025.

* cited by examiner

*Primary Examiner* — Yong J Choe
(74) *Attorney, Agent, or Firm* — IP&T GROUP LLP

(57) ABSTRACT

A storage apparatus includes a memory device including a plurality of word lines; and a word line grouping device configured to group the plurality of word lines into a certain number of groups each serving as a memory block so that a read performance value, obtained by reading data of word lines included in a same group by using a representative read voltage, is satisfied with a set tolerance value.

14 Claims, 11 Drawing Sheets

Figure 2:
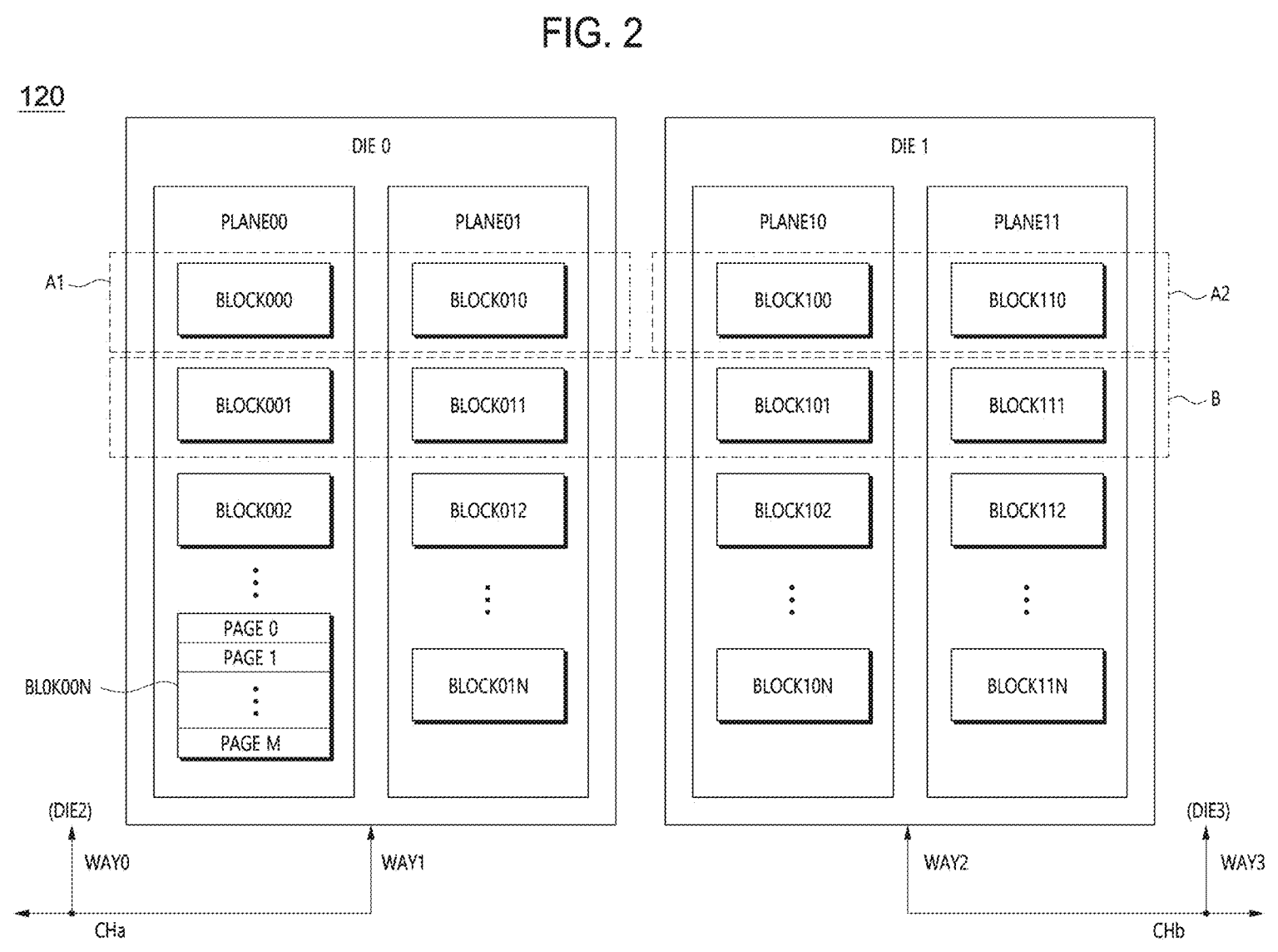

DIE 0
PLANE00
BLOCK000
BLOCK001
BLOCK002
PAGE 0
PAGE 1
PAGE M
PLANE01
BLOCK010
BLOCK011
BLOCK012
BLOCK01N

DIE 1
PLANE10
BLOCK100
BLOCK101
BLOCK102
BLOCK10N
PLANE11
BLOCK110
BLOCK111
BLOCK112
BLOCK11N

A1
A2
B
BLOK00N
(DIE2)
WAY0
WAY1
CHa
(DIE3)
WAY2
WAY3
CHb

| | OFFSET 0 | OFFSET 1 | OFFSET 2 | • • • | OFFSET k |
|---|---|---|---|---|---|
| WL0 | $FBC_{0,0}$ | $FBC_{0,1}$ | $FBC_{0,2}$ | • • • | $FBC_{0,k}$ |
| WL1 | $FBC_{1,0}$ | $FBC_{1,1}$ | $FBC_{1,2}$ | • • • | $FBC_{1,k}$ |
| WL2 | $FBC_{2,0}$ | $FBC_{2,1}$ | $FBC_{2,2}$ | • • • | $FBC_{2,k}$ |
| ⋮ | ⋮ | ⋮ | ⋮ | ⋮ | ⋮ |
| WLj | $FBC_{j,0}$ | $FBC_{j,1}$ | $FBC_{j,2}$ | • • • | $FBC_{j,k}$ |

<GROUP 0>

STORAGE APPARATUS INCLUDING WORD LINE GROUPING DEVICE AND OPERATING METHOD THEREOF

CROSS-REFERENCES TO RELATED APPLICATION

The present application claims priority under 35 U.S.C. § 119(a) to Korean Patent Application Number 10-2024-0022408, filed on Feb. 16, 2024, which is incorporated herein by reference in its entirety.

BACKGROUND

1. Technical Field

Various embodiments of the present disclosure generally relate to a semiconductor integrated apparatus, and more particularly, to a storage apparatus including a word line grouping device and an operation method thereof.

2. Related Art

A semiconductor memory device may include a plurality of memory cells coupled between a plurality of word lines and a plurality of bit lines.

To store data in the semiconductor memory device or to read data stored in the semiconductor memory device, voltages set according to operation modes are applied to the word lines and the bit lines.

A flash memory device such as a nonvolatile memory device may have a hierarchical structure which extends to pages (i.e., word lines), memory blocks, planes, and dies. The number of word lines per block may be increased to scale down a chip size of the flash memory device, and thus, an access count per each block may be increased to cause read disturbance.

A read retry method may be adopted to cope with variation of a threshold voltage of a memory cell due to the read disturbance. The read retry method performs a read operation again by changing a read voltage level when the read operation for a read target word line failed. The semiconductor memory device may retry the read operation based on a read retry table in which read voltage information to be changed in a read retry operation is stored in units of memory blocks or dies.

As the number of word lines stacked within a block is increased, threshold voltages of word lines included in the same block may have various distributions due to iterative read operations. Accordingly, read characteristics of the word lines included in the same block may be different from each other.

SUMMARY

Embodiments of the present disclosure are provided for a storage apparatus capable of grouping a plurality of word lines in a memory block according to a threshold voltage distribution, and an operating method thereof.

In an embodiment of the present disclosure, a storage apparatus may include a memory device including a plurality of word lines; and a word line grouping device configured to group the plurality of word lines into a certain number of groups, so that a read performance value, obtained by reading data of word lines included in a same group by using a representative read voltage, is satisfied with a set tolerance value.

In an embodiment of the present disclosure, an operating method of a storage apparatus which includes a memory device including a plurality of word lines; and a storage controller configured to control the memory device, the method comprising: the storage controller grouping a plurality of word lines into a certain number of groups; and the storage controller regrouping the plurality of word lines so that a read performance value obtained by reading data of word lines included in a same group by using a representative read voltage, is satisfied with a set tolerance value.

According to embodiments of the present technology, a successful read operation may be guaranteed by grouping word lines having similar threshold voltage distributions and applying a read voltage to the word lines in units of groups.

These and other features, aspects, and embodiments are described in more detail below.

BRIEF DESCRIPTION OF THE DRAWINGS

The above and other aspects, features and advantages of the embodiments of the present disclosure will be more clearly understood from the following detailed description taken in conjunction with the accompanying drawings, in which:

FIG. 2 is a diagram illustrating a configuration of a memory device according to an embodiment of the present disclosure;

DETAILED DESCRIPTION

Various embodiments of the present disclosure are described in detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of embodiments of the present disclosure. However, the embodiments of the present disclosure should not be construed as being limited to the disclosed embodiments. Although a few embodiments of the present disclosure are shown and described, it will be appreciated by those of ordinary skill in the art that changes may be made to these embodiments without departing from the principles and spirit of the present disclosure.

Figure 1:
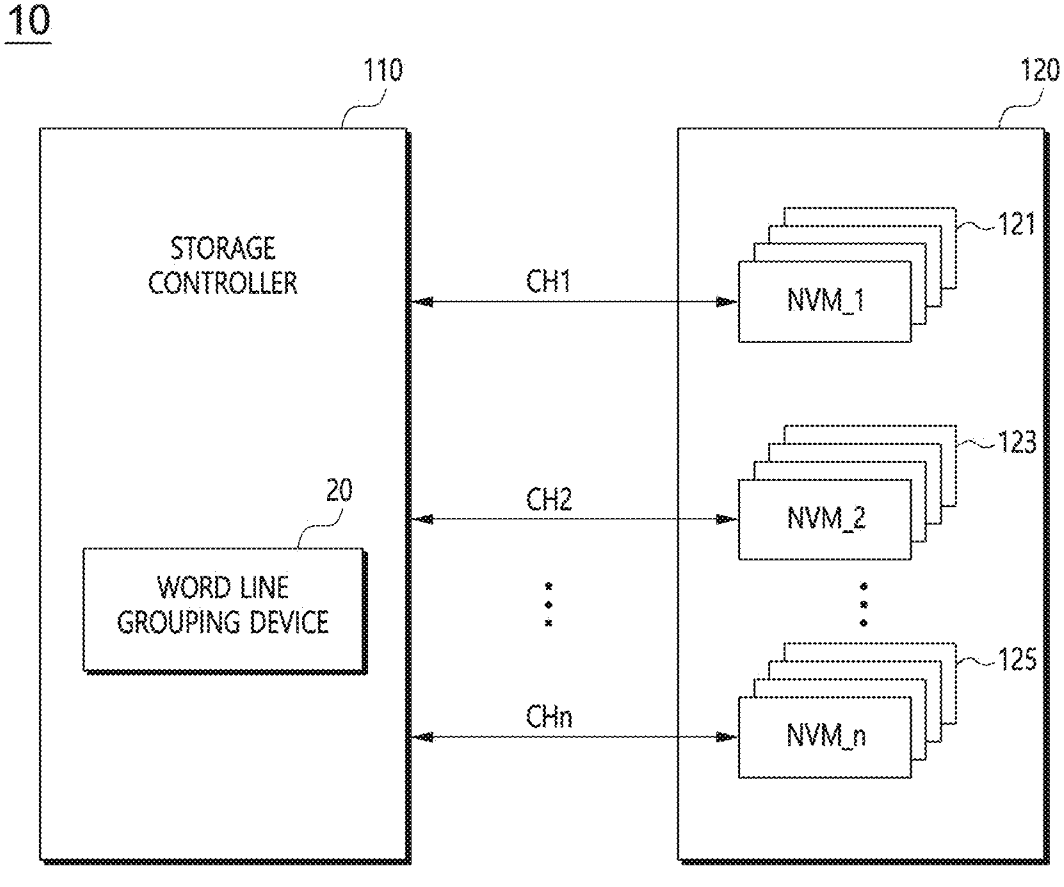
FIG. 1 is a diagram illustrating a configuration of a storage apparatus according to an embodiment of the present disclosure.

FIG. 1 is a diagram illustrating a configuration of a storage apparatus 10 according to an embodiment of the present disclosure.

Referring to FIG. 1, the storage apparatus 10 may include a storage controller 110 and a memory device 120. The memory device 120 may include at least a plurality of nonvolatile memory devices 121, 123, and 125.

The storage controller 110 and the memory device 120 may be coupled through a plurality of channels CH1, CH2, and CHn.

In response to a write request of an external apparatus (not shown), the storage apparatus 10 may program write-requested data in the memory device 120 according to control of the storage controller 110.

In response to a read request of the external apparatus, the storage apparatus 10 may read data stored in the memory device 120 and provide the read data to the external apparatus according to control of the storage controller 110.

The storage apparatus 10 may read data of the memory device 120 or program data in the memory device 120 to perform the read request of the external apparatus as well an internal operation of the storage apparatus 10. The internal operation may include a house-keeping operation such as garbage collection and wear levelling.

The storage controller 110 may provide interfacing between the external apparatus and the memory device 120. The storage controller 110 according to an embodiment may include a word line grouping device 20.

The memory device 120 may have a hierarchical structure which extends to pages as a set of memory cells sharing a word line, memory blocks as a set of a certain number of pages, planes as a set of a certain number of memory blocks, and dies as a set of a certain number of planes.

The word line grouping device 20 may group word lines of blocks by a certain number. Specifically, the word line grouping device 20 according to the present technology may group the word lines so that the read performance value is satisfied with a set threshold value when data stored in the plurality of word lines included in the same group are read by a representative read voltage for each logic level.

In an embodiment, the word line grouping device 20 may classify the word lines within each block into a certain number of initial groups (hereinafter, referred to as initial group number), and determine a read voltage, by which the read performance value is optimized, as a representative read voltage of each initial group. Further, the word line grouping device 20 may regroup the word lines by adjusting (extending or reducing) a size of a group so that the read performance value, obtained by reading data of the word lines in each group by using the representative read voltage to the group, is satisfied with the set threshold value.

Therefore, the word lines within the block may be classified into the groups, and the representative read voltage for each group may be determined. The storage controller 110 may generate the representative read voltage for each group and an offset voltage determined according to the representative read voltage as a read retry table.

Single-bit data or multi-bit data may be stored in the memory cells constituting the memory device 120.

When the memory cell stores the single-bit data, the representative read voltage of each group may be a read voltage which optimizes the read performance value which distinguishes a logic level of the single-bit data.

When the memory cell stores the multi-bit data, logic levels of the data stored in the memory cell may be distinguished by different read voltages according to bit positions of the multi-bit data. The read voltage for distinguishing the data stored in the memory cell, which stores the multi-bit data, may be configured of a set of read voltages classified according to bit positions, and the representative read voltages of the groups may be a set of read voltages in which the read performance value is optimized.

In an embodiment, the read performance value may be determined as at least one of a maximum fail bit count (MAX FBC) and a read pass rate (RPR).

The maximum fail bit count (MAX FBC) may be a maximum value of a fail bit count (FBC) of each word line for each of a plurality of candidate read voltages when data of word lines in each group are read by using the candidate read voltage. The representative read voltage which optimizes the maximum fail bit count (MAX FBC) may be determined as the candidate read voltage which minimizes the maximum fail bit count (MAX FBC).

The read pass rate (RPR) may be defined as a ratio of the number of word lines (hereinafter, referred to as 'word line number') having the fail bit count (FBC) within error correction capability to the total number of word lines (hereinafter, referred to as 'total word line number') within the group for each candidate read voltage when data of the word lines in each group are read by using the plurality of candidate read voltages. The representative read voltage which optimizes the read pass rate (RPR) may be determined as the candidate read voltage which maximizes the read pass rate (RPR).

The word line grouping device 20 according to the present technology may improve the read pass rate (RPR) of each group by determining (deriving) the representative read voltage for the group based on at least one read performance value of the maximum fail bit count (MAX FBC) and the read pass rate (RPR) and adjusting the group size so that the read performance value is satisfied with the set threshold value.

FIG. 2 is a diagram illustrating a configuration of a memory device 120 according to an embodiment of the present disclosure.

The memory device 120 in FIG. 2 may be an embodiment of the nonvolatile memory devices 121, 123 and 125 in FIG. 1.

Referring to FIG. 2, the memory device 120 may include plural dies DIE0 and DIE1, and each of the dies DIE0 and DIE1 may include plural planes PLANE00/PLANE01 and PLANE10/PLANE11. Each of the planes PLANE00/PLANE01 and PLANE10/PLANE11 may include a plurality of memory blocks BLOCK000 to BLOCK00N/BLOCK010 to BLOCK01N and BLOCK100 to BLOCK10N/BLOCK110 to BLOCK11N. Each of the memory blocks BLOCK000 to BLOCK00N/BLOCK010 to BLOCK01N and BLOCK100 to BLOCK10N/BLOCK110 to BLOCK11N may include a plurality of pages PAGE 0 to PAGE M. The pages PAGE 0 to PAGE M may be equivalent to the word lines.

The memory device 120 may input/output data through channels CHa and CHb. The channels CHa and CHb may input/output data through an interleaving manner. Each of channels CHa and CHb may be branched into a plurality of ways WAY0/WAY1 and WAY2/WAY3 which share the channels CHa and CHb, respectively. The plurality of ways WAY0/WAY1 and WAY2/WAY3 may be coupled, for example, to dies DIE2/DIE0 and DIE1/DIE3, respectively.

It has been illustrated in FIG. 2 that the dies DIE0/DIE2 and DIE1/DIE3 are coupled to the ways WAY1/WAY0 and WAY2/WAY3 branched from the channels CHa and CHb, respectively, but the embodiments are not limited thereto.

The storage controller 110 may be configured to form a super block by grouping simultaneously selectable blocks from among the plurality of memory blocks.

The super block may be configured of a set of simultaneously selectable blocks. For example, the word line grouping device 20 may be configured to form super blocks A1 and A2 by grouping memory blocks included in different planes within the same die or to form a super block B by grouping memory blocks in different planes within a plurality of dies.

Based on a result that data of the plurality of pages PAGE 0 to PAGE M included in each of the memory blocks BLOCK000 to BLOCK00N/BLOCK010 to BLOCK01N and BLOCK100 to BLOCK10N/BLOCK110 to BLOCK11, for example, data of the word lines are read by using the plurality of candidate read voltages, the word line grouping device 20 may group the memory blocks according to the representative read voltage which is satisfied with the required read performance value. The read performance may be improved by applying an offset voltage corresponding to the representative read voltage determined (derived) for each group to the read retry operation.

Figure 3:
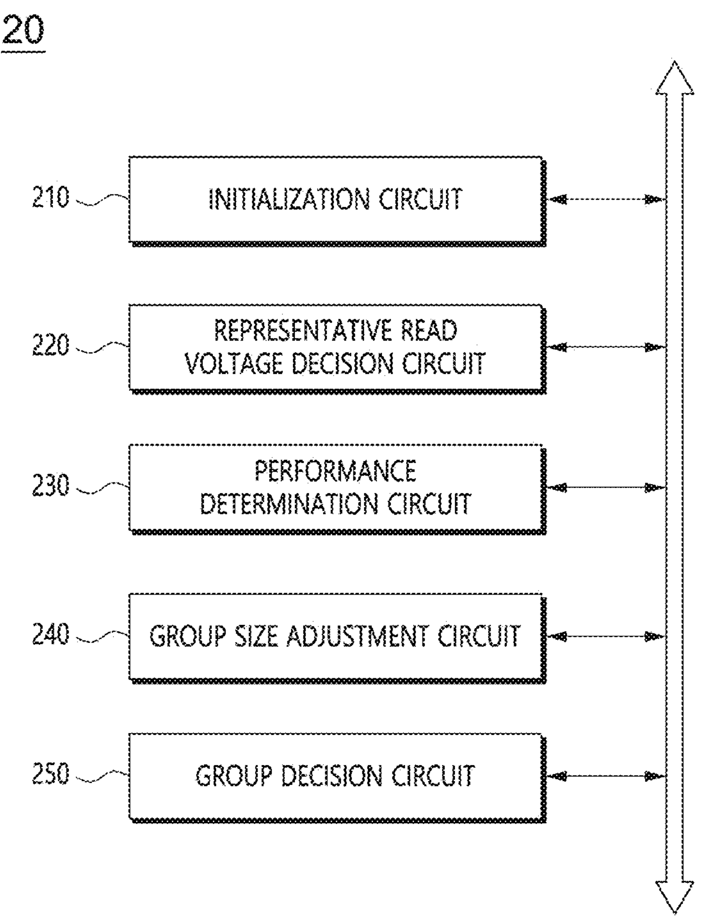
FIG. 3 is a diagram illustrating a configuration of a word line grouping device according to an embodiment of the present disclosure.

FIG. 3 is a diagram illustrating a configuration of the word line grouping device 20 of FIG. 1, according to an embodiment of the present disclosure.

Referring to FIG. 3, the word line grouping device 20 may include an initialization circuit 210, a representative read voltage decision circuit 220, a performance determination circuit 230, a group size adjustment circuit 240, and a group decision circuit 250.

The initialization circuit 210 may set an initial parameter for word line grouping.

In an embodiment, the initial parameter may include a default read voltage, an initial group number N, a first threshold value TH1, a second threshold value TH2, a third threshold value TH3, and a search direction.

The default read voltage may be threshold voltage distribution data of the memory blocks included in the specification of the memory device 120. The default read voltage may be stored in a special block of the memory device 120, and the initialization circuit 210 may acquire the default read voltage from the special block.

The initial group number N may be an initial group number of each block. The initialization circuit 210 may initially group the word lines of each block according to the initial group number N. In an embodiment, the initialization circuit 210 may generate the initial group by dividing the word lines included in the block by the initial group number N.

The first threshold value TH1 may be an error correction capability of the storage controller 110.

The second threshold value TH2 may be a tolerance value for the read performance value of each group.

The third threshold value TH3 may be a criterion value for terminating group size adjustment and fixing a group size.

The search direction may be a selection direction of a search target group when adjusting the group size. Addresses may be assigned to the word lines within the memory block in an ascending order along a specific direction, and the group search direction may be selected from among a direction that the word line address is increased and a direction that the word line address is reduced.

Based on the read result obtained when the plurality of candidate read voltages are applied to the initial groups of each block, which are determined through the initialization circuit 210, respectively, the representative read voltage decision circuit 220 may determine (derive) the representative read voltage by which the read performance value (e.g., at least one of the maximum fail bit count (MAX FBC) and the read pass rate (RPR)) is optimized.

In an embodiment, the candidate read voltage may include a default read voltage acquired through the initialization circuit 210 and a plurality of offset voltages in which the default read voltage is shifted by a set amount.

In an embodiment, the read performance value may be determined as at least one of the maximum fail bit count (MAX FBC) and the read pass rate (RPR).

The maximum fail bit count (MAX FBC) may be defined as the maximum value of the fail bit count (FBC) of each word line for the plurality of candidate read voltages when the data of the word lines in each group are read by using the plurality of candidate read voltages. The representative read voltage, which optimizes the maximum fail bit number (MAX FBC), may be determined as the candidate read voltage which minimizes the maximum fail bit count (MAX FBC).

The read pass rate (RPR) may be defined as a ratio of the word line number having the fail bit count (FBC) within the error correction capability (TH1) to the total word line number within the group for the candidate read voltages when the data of the word lines of each group are read by using the plurality of candidate read voltages. The representative read voltage, which optimizes the read pass rate (RPR), may be determined as the candidate read voltage which maximizes the read pass rate (RPR).

The performance determination circuit 230 may determine whether or not the read performance value, obtained by reading the data of the word lines of each group by using the representative read voltage, is satisfied with the second threshold value TH2. The performance determination circuit 230 may determine whether or not the read performance value of the group, by which the read performance value is satisfied with the second threshold value TH2, is satisfied with the third threshold value TH3 as a group fixing condition.

The group size adjustment circuit 240 may fix a performance determination target group or may extend or reduce a size of the performance determination target group, based on the determination result of the performance determination circuit 230.

For example, when the read performance value of the search target group is satisfied with the second threshold value TH2 and simultaneously is satisfied with the third threshold value TH3, the group size adjustment circuit 240 may fix the size of the corresponding group without adjustment of the size of the group.

A fact that the read performance value of the group is satisfied with the second threshold value TH2 may mean that the read pass rate (RPR) obtained by data stored in the corresponding group by using the representative read voltage is guaranteed over a certain level or that the maximum fail bit count (MAX FBC) is guaranteed below a certain level.

A fact that the read performance value of the group is satisfied with the third threshold value TH3 may mean that the read performance value of the corresponding group is very close to the second threshold value TH2.

When the read performance value of the search target group is satisfied with the second threshold value TH2, but is not satisfied with the third threshold value TH3, for example, when the degree that the read performance value is satisfied with the second threshold value TH2 is equal to or larger than the third threshold value TH3, the group size adjustment circuit 240 may extend the size of the group through a method of adding a word line physically adjacent to the corresponding search target group. The group size adjustment circuit 240 may fix the group just before the extended group as a final group, when the read performance value of the extended group is not satisfied with the second threshold value TH2.

When the read performance value of the search target group is not satisfied with the second threshold value TH2, the group size adjustment circuit 240 may reduce the group size through a method of eliminating a portion of word lines included in a corresponding group from the corresponding group. For example, the word lines eliminated from the corresponding group may be word lines adjacent to a physical boundary of the corresponding group, but is the embodiments are not limited thereto. When the read performance value of the reduced group is satisfied with the second threshold value TH2, the group size adjustment circuit 240 may fix or extend the group size according to whether or not the read performance value of the reduced group is satisfied with the third threshold value TH3.

The group size adjustment circuit 240 may terminate the group size adjustment and fix the group when the read performance values of all groups are satisfied with the second threshold value TH2.

When the group size is fixed by the group size adjustment circuit 240, the group decision circuit 250 may output the maximum value or the minimum value of the word line addresses included in the fixed group as a separator for each group.

For example, word line addresses which are increased from a word line located adjacent to a semiconductor substrate toward a word line located far away from the semiconductor substrate may be assigned to word lines of a stacked (three-dimensional, 3D) memory device. The word line grouping may be performed from an upper word line toward a lower word line or from the lower word line toward the upper word line, according to the search direction for grouping the word lines. When the groups are fixed, the group decision circuit 250 may output the word line address corresponding to a boundary between physically adjacent groups as a separator.

Figure 4:
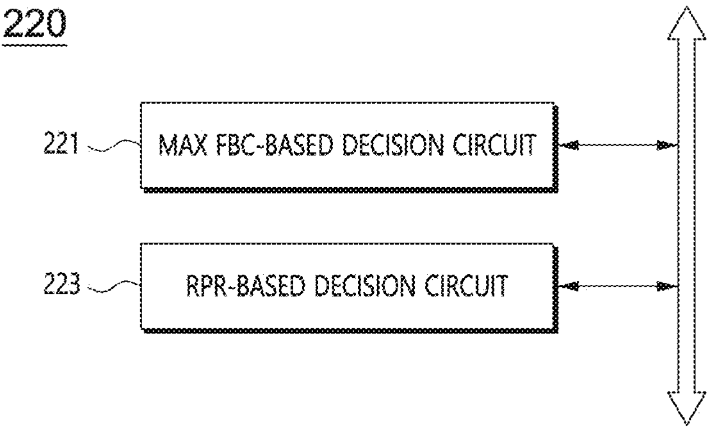
FIG. 4 is a diagram illustrating a configuration of a representative read voltage decision circuit according to an embodiment of the present disclosure.

FIG. 4 is a diagram illustrating a configuration of the representative read voltage decision circuit 220 of FIG. 3, according to an embodiment of the present disclosure.

Referring to FIG. 4, the representative read voltage decision circuit 220 may include a MAX FBC-based decision circuit 221 and a RPR-based decision circuit 223.

The MAX FBC-based decision circuit 221 may calculate the maximum fail bit count (MAX FBC), which is the maximum value of the fail bit count (FBC) of each word line for the candidate read voltages, when the data of the word lines in each group are read by using at least a portion of the plurality of candidate read voltages. The MAX FBC-based decision circuit 221 may determine the candidate read voltage, which minimizes the maximum fail bit count (MAX FBC), as the representative read voltage.

The RPR-based decision circuit 223 may calculate the read pass rate (RPR), which is the ratio of the word line number having the fail bit count (FBC) within the error correction capability to the total word line number within the group, when the data of the word lines in each group are read by using at least a portion of the plurality of candidate read voltages. The RPR-based decision circuit 223 may determine the candidate read voltage, which maximizes the read pass rate (RPR), as the representative read voltage.

For example, in a case where an i-th candidate read voltage is applied, the read pass rate (RPR) may be calculated as the following Equation 1.

$$WL \text{ pass rate}_i = \frac{\# WL \text{ samples recovered by } ith\ RR}{\# \text{total } WL \text{ samples}} \quad \text{[Equation 1]}$$

When the memory cell operates to store multi-bit data, the word line number covered by each candidate read voltage (#WL samples recovered by an i-th RR) may be derived from the following Equation 2.

$$\#WLs(\max FBC \le th1)/\#\text{total } WLs := \min\{\#LSBs(\max FBC \le th1), \#CSBs(\max FBC \le th1), \#MSBs(\max FBC \le th1)\}/\#\text{total } WLs \quad \text{[Equation 2]}$$

Figures 5, 6:
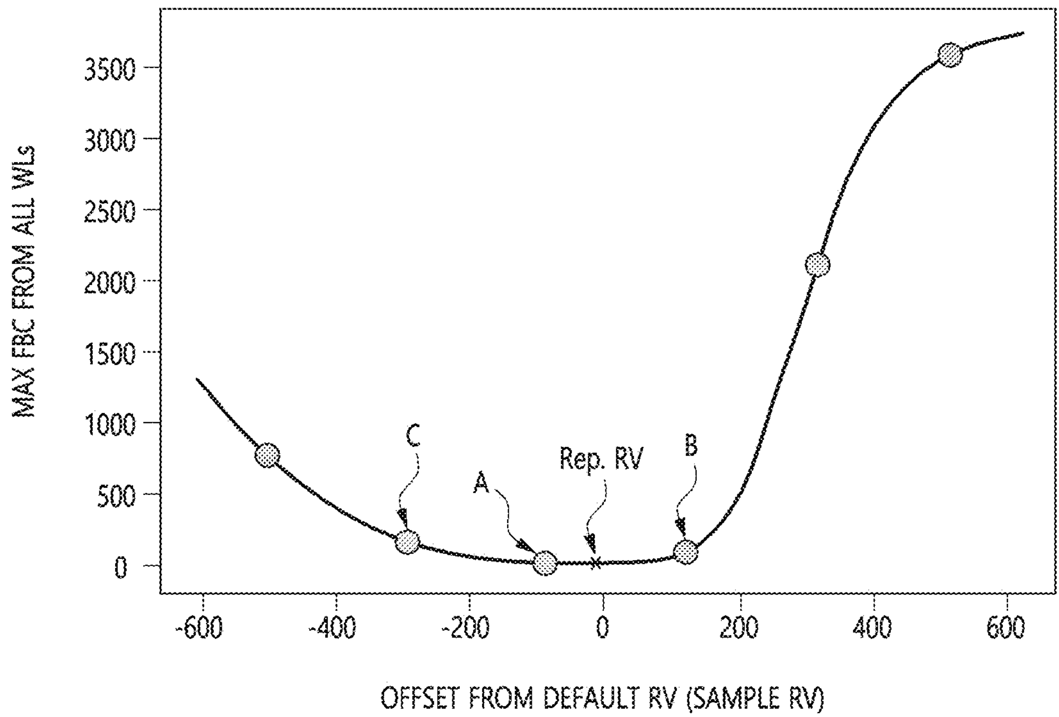
FIG. 5 is a diagram for describing a calculation concept of a maximum fail bit count according to an embodiment of the present disclosure.
FIG. 6 is a diagram for describing a calculation concept of a maximum fail bit count according to an embodiment of the present disclosure.

FIG. 5 is a diagram for describing a calculation concept of a maximum fail bit count (MAX FBC) according to an embodiment of the present disclosure.

Referring to FIG. 5, when data of a plurality of word lines WL0, WL1, WL2, . . . , WLj included in a specific group Group 0 are read by using a plurality of candidate read voltages OFFSET0, OFFSET1, OFFSET2, . . . , OFFSETk, the fail bit count (FBC) ($FBC_{0,0}$, $FBC_{1,0}$, $FBC_{2,0}$, . . . , $FBC_{j,0}$), ($FBC_{0,1}$, . . . , $FBC_{j,1}$) ($FBC_{0,2}$, . . . , $FBC_{j,2}$), . . . , ($FBC_{0,k}$, . . . , $FBC_{j,k}$) of the word lines for the candidate read voltages may be derived.

The MAX FBC-based decision circuit 221 may determine (derive) maximum values among the fail bit counts (FBCs) of the word line WO0, WL1, WL2, . . . , WLj for the candidate read voltages OFFSET0, OFFSET1, OFFSET2, . . . , OFFSETk as the maximum fail bit counts (MAX FBCs). For example, the maximum fail bit counts (MAX FBCs) of the word lines WO0, WL1, WL2, . . . , WLj for the candidate read voltage OFFSET0 may be $MAX\{FBC_{0,0}, FBC_{1,0}, FBC_{2,0}, \ldots, FBC_{j,0}\}$.

The MAX FBC-based decision circuit 221 may determine the candidate read voltage corresponding to the minimum value among the maximum fail bit counts (MAX FBCs) for the candidate read voltages, as the representative read voltage.

When a memory cell stores multi-bit data, the logic levels of the data stored in the memory cell may be distinguished by different read voltages according to bit positions of the data. The maximum fail bit count (MAX FBC) of the memory cell which stores the multi-bit data may be a sum of the fail bit counts (FBCs) according to the bit positions.

FIG. 6 is a diagram for describing a calculation concept of a maximum fail bit count (MAX FBC) according to an embodiment of the present disclosure.

Referring to FIG. 6, a portion of the candidate read voltages may be selected as sample read voltages Sample RV, and the minimum value of the maximum fail bit count (MAX FBC) may be estimated based on the fail bit counts (FBCs) of the word lines for the sample read voltages Sample RV.

In an embodiment, the max FBC-based decision circuit 221 may calculate the maximum values of the fail bit counts (FBCs) of the word lines for the sample read voltages Sample RV, and determine the sample read voltage, which minimizes the maximum fail bit count (MAX FBC), as the representative read voltage.

In an embodiment, the MAX FBC-based decision circuit 221 may calculate a voltage corresponding to the minimum MAX FBC, which is estimated based on the maximum fail bit counts (FAX FBCs) of the word lines for the sample read voltages Sample RV, as the representative read voltage.

For example, the MAX FBC-based decision circuit 221 may determine an average of two read voltages A and B by which the maximum fail bit counts (MAX FBCs) are relatively small among the sample read voltage Sample RV as the representative read voltage Rep. RV.

For example, the MAX FBC-based decision circuit 221 may additionally calculate the maximum fail bit counts (MAX FBCs) for the offset sample read voltages and determine the voltage, which minimizes the maximum fail bit count (MAX FBC), from the read result corresponding to the sample read voltage and the offset sample read voltage, as the representative read voltage.

In an embodiment, the offset sample read voltage may include at least one read voltage A by which the maximum fail bit count (MAX FBC) is relatively small, among the sample read voltages Sample RV is increased or reduced by a certain amount. In another example, the offset sample read voltage may be a voltage corresponding to an average voltage of at least two read voltages A and B by which the maximum fail bit counts (MAX FBC) are relatively small.

In a further example, the MAX FBC-based decision circuit 221 may calculate a vertex by fitting coordinates of three points A, B, C having the relatively small maximum fail bit counts (MAX FBCs) among the sample read voltages to a two dimensional (2D) curve and determine a voltage corresponding to the vertex as the representative voltage Rep. RV.

The method of determining the representative read voltage based on the max fail bit count (MAX FBC) is not limited thereto, but the method of determining the read voltage which minimizes the fail bit count (FBC) as the representative read voltage may be variously modified.

Figure 7A:
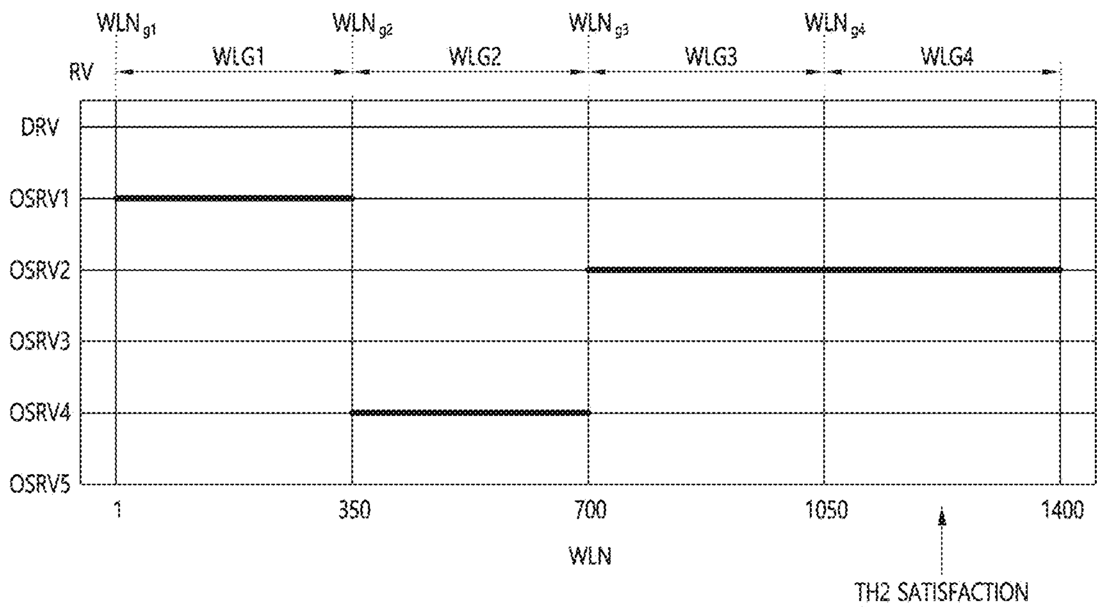
FIGS. 7A and 7B are diagrams for describing a group size adjustment concept according to a read performance value according to an embodiment of the present disclosure.
Figure 7B:
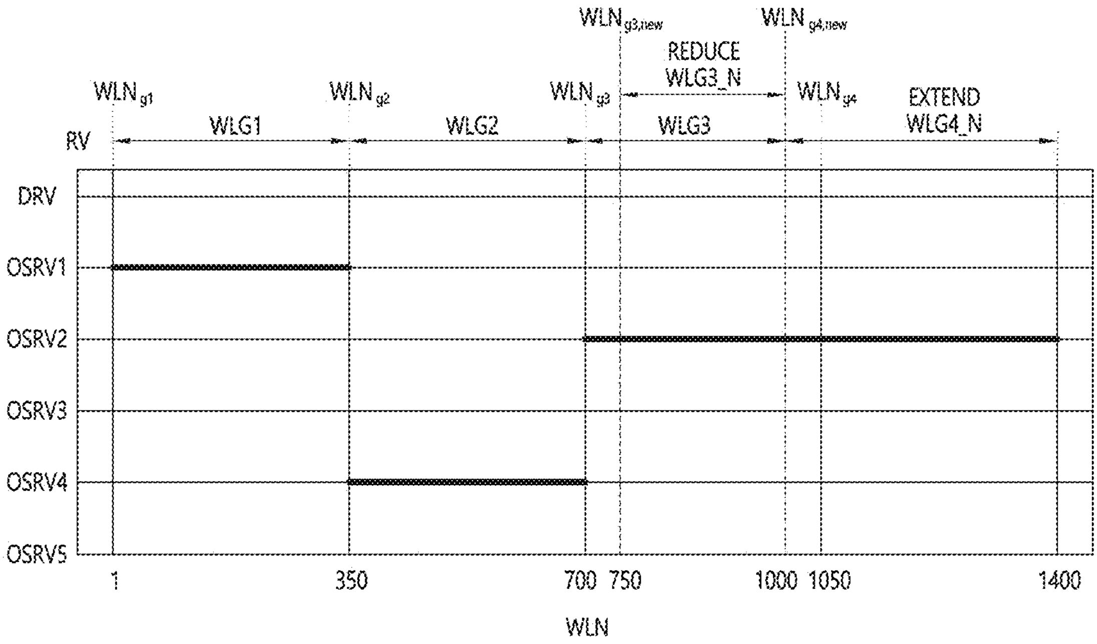

FIGS. 7A and 7B are diagrams for describing a group size adjustment concept according to a read performance value according to an embodiment of the present disclosure.

Referring to FIG. 7A, a memory block including word lines having word line addresses WLN of 1 to 1400 may be classified into four initial groups WLG1, WLG2, WLG3, and WLG4. The word line addresses WLN corresponding to boundaries between the initial groups WLG1, WLG2, WLG3, and WLG4 may be set as $WLN_{g1}$(1), $WLN_{g2}$(350), $WLN_{g3}$(700), $WLN_{g4}$(1050) based on the initial group number (N=4).

The representative read voltage decision circuit 220 may determine (derive) the representative read voltages of the groups WLG1, WLG2, WLG3, and WLG4 as OSRV1, OSRV4, OSRV2, and OSRV2 based on the read performance value (MAX FBC and/or RPR).

The performance determination circuit 230 may determine whether or not the read performance values of the groups WLG1, WLG2, WLG3, and WLG4 are satisfied with the second threshold value TH2.

The group size adjustment circuit 240 may be configured to extend the group size until the read performance values of the groups WLG1 to WLG4 are satisfied with the third threshold value TH3 when the read performance values of the groups WLG1 to WLG4 are satisfied with the second threshold value TH2, and to reduce the group size when the read performance values of the groups WLG1 to WLG4 are not satisfied with the second threshold value TH2.

In an embodiment, the group size adjustment circuit 240 may sequentially select the group according to the search direction determined based on the physical positions of the word lines to adjust the group size. For example, the group size adjustment circuit 240 may adjust the group size while sequentially selecting the group in a direction that the word line address is increased, for example, to a direction of from the first group WLG1 toward the fourth group WLG4. In another example, the group size adjustment circuit 240 may adjust the group size while sequentially selecting the group in a direction that the word line address is reduced, for example, a direction from the fourth group WLG4 towards the first group WLG1.

FIG. 7A illustrates a case where the fourth group GWL4 is satisfied with the second threshold value TH2 when grouping by selecting the group in a descending direction of the word line address.

The group size adjustment circuit 240 may extend the size of the fourth group WLG4 according to a set criterion as shown in FIG. 7B. As the size of the fourth group WLG4 is extended, the word line address corresponding to the boundary between the fourth group WLG4 and the third group WLG3 may be changed from WLNg4(1050) to WLNg4, new(1000). As the size of the fourth group WLG4 is extended, the word line addresses included in the new fourth group WLG4_N may be adjusted as 1000 to 1400, and the word line addresses included in the third group WLG3 may be adjusted as 700 to 1000.

Subsequently, the group size adjustment circuit 240 may determine whether or not the read performance value of the third group WLG3 is satisfied with the second threshold value TH2. When it is determined that the read performance value of the third group WLG3 is not satisfied with the second threshold value TH2, the group size adjustment circuit 240 may reduce the size of the third group WLG3.

As the size of the third group WLG3 is reduced, the word line address corresponding to the boundary between the third group WLG3 and the second group WLG2 may be changed from WLNg3(700) to WLNg3,new(750). As the size of the third group WLG3 is reduced, the word line addresses included in the new third group WLG3_N may be adjusted as 750 to 1000, and the word line addresses included in the second group WLG2 may be adjusted as 350 to 750.

Subsequently, although not shown in drawings, the sizes of the first group WLG1 and the second group WLG2 may also be adjusted according to whether or not the read performance values of the first and second groups WLG1 and WLG2 are satisfied with the second and third threshold values TH2 and TH3.

When the read performance value of the group is satisfied with the second threshold value TH2 and simultaneously satisfied with the third threshold value TH3, the group size adjustment circuit 240 may fix the size of the corresponding group without adjustment of the group size.

When the read performance values of all groups WLG1 to WLG4 are satisfied with the second threshold value TH2, the group size adjustment circuit 240 may terminate the group size adjustment.

As described above, the second threshold value TH2 may be a criterion for determining the read performance value of the finally fixed group.

As the initial group number N is increased, the word line number included in each group may be reduced, and thus the second threshold value TH2 may be set to be small. For example, the initial group number N and the second threshold value TH2 may be inversely proportional to each other.

To extend or reduce the group size, the following Equation 3 may be used, but the embodiments are not limited thereto.

[Equation 3]

• For each iteration,

✓ For each $WLG$,

– Employ the MAX $FBC$ or $RPR$

– $WLN$ set update: Select according to $TH2$ satisfaction $$* \text{ Reward}(E): WLN_{gi,new} = WLN_{g(i-1)} \times a1 + WLN_{gi} \times b1$$

$$* \text{ Penalty}(R): WLN_{gi,new} = WLN_{g(i+1)} \times a2 + WLN_{gi} \times b2$$

$$* \text{ Penalty}(R)\,S < \text{Reward}(E)\,S \Rightarrow a1 > a2,\ b1 < b2$$

$$* \text{ Penalty}(R)\,S > \text{Reward}(E)\,S \Rightarrow a1 < a2,\ b1 > b2$$

$$* \ ai + bi = 1,\ 0 \le ai,\ bi \le 1$$

wherein $E$ is "extend", $R$ is "reduce", and $S$ is "size"

Equation 3 is an example that the search direction is a direction that the word line address is reduced from an upper side to a lower side. When the search direction is reversely set, the extension/reduction equation may be reversely used.

Search convergence speed and an overall read performance value may be changed according to setting values of a1, a2, b1, and b2.

The group search may be iterated until all groups are satisfied with the second threshold value TH2.

As described above, the group size adjustment circuit 240 may sequentially select a group according to the search direction, extend the group size so that the read performance value of the selected group is satisfied with the third threshold value TH3 when the read performance value of the selected group is satisfied with the second threshold value TH2, and reduce the group size when the read performance value of the selected group is not satisfied with the second threshold value TH2. Further, when the read performance values of all groups are satisfied with the second threshold value TH2, the group size adjustment circuit 240 may terminate the group size adjustment.

Figure 8A:
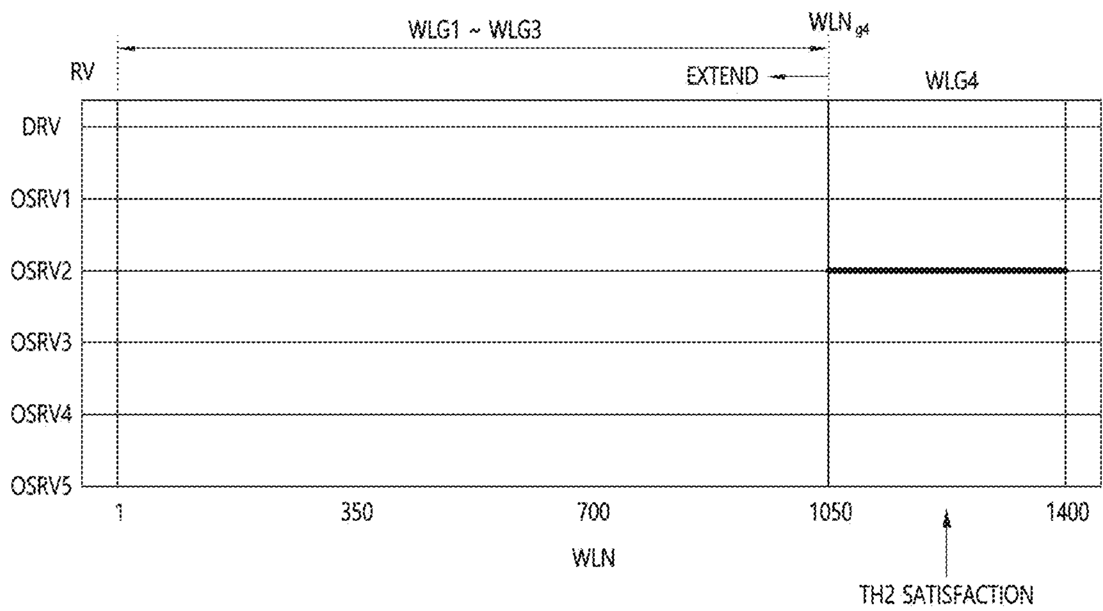
FIGS. 8A to 8C are diagrams for describing a group size adjustment concept according to a read performance value according to an embodiment of the present disclosure.
Figure 8B:
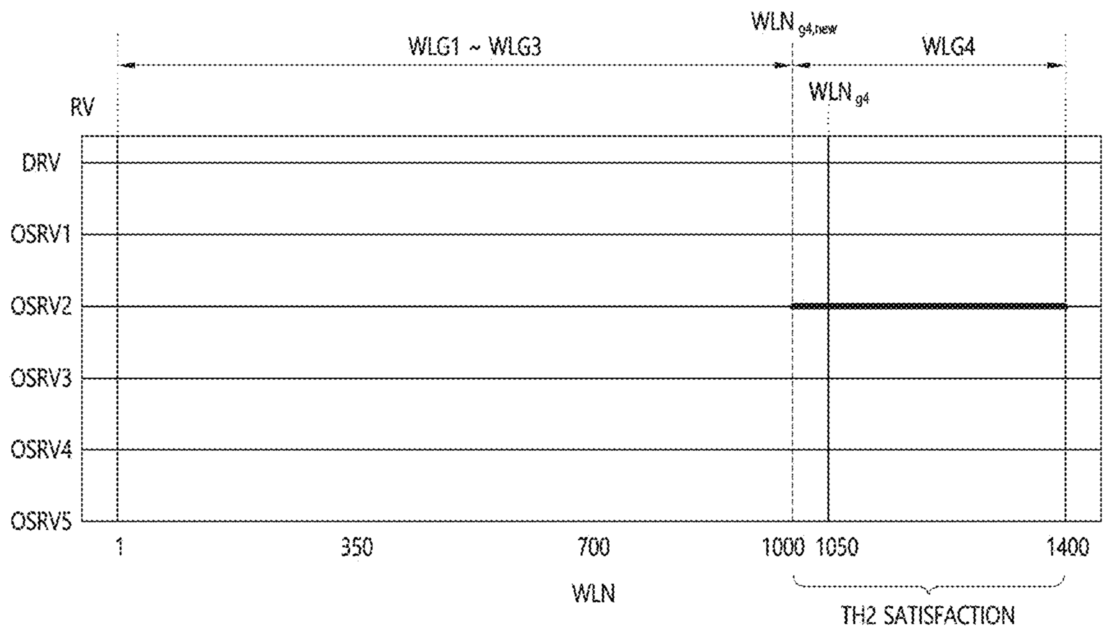
Figure 8C:
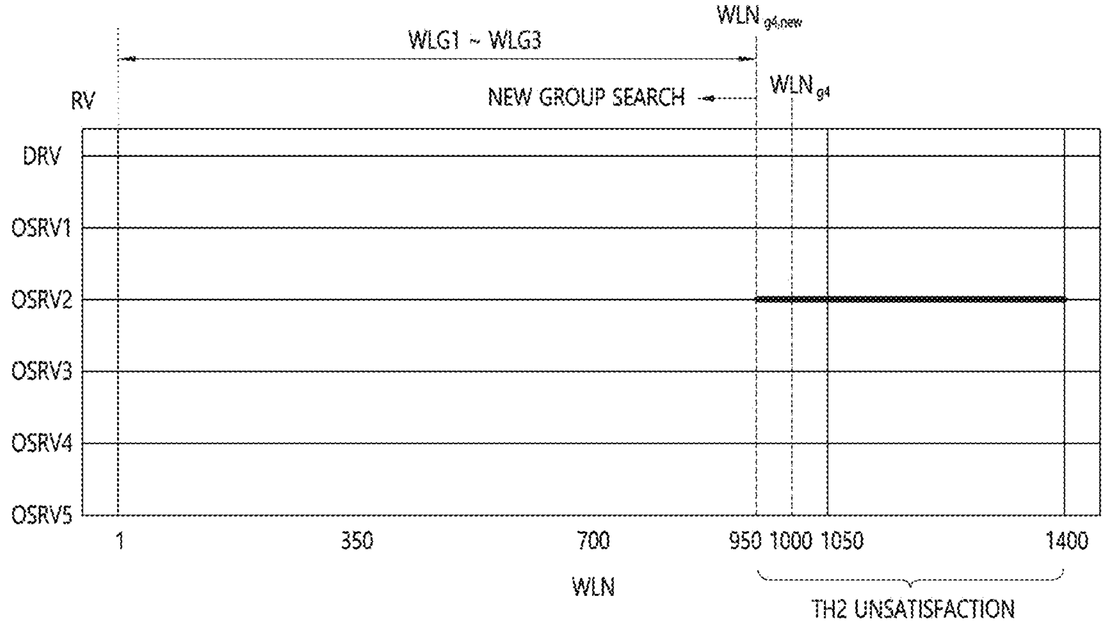

FIGS. 8A to 8C are diagrams for describing a group size adjustment concept according to a read performance value according to an embodiment of the present disclosure.

In the present embodiment, the group size adjustment circuit 240 may select a group as a search target according to the search diction, extend the size of the selected group until the read performance value of the selected group is satisfied with the second threshold value TH2, and fix the size of the search target group to a size just before the read performance value of the group is not satisfied with the second threshold value TH2.

When the size of the search target group is fixed, the group size adjustment circuit 240 may perform a new group search on the remaining word lines.

Referring back to FIG. 7A, the memory block including the word lines having the word line addresses WLN of 1 to 1400 may be classified into the four initial groups WLG1, WLG2, WLG3, and WLG4. The word line addresses WLN corresponding to the boundaries between the initial groups WLG1, WLG2, WLG3, and WLG4 may be set as $WLN_{g1}$(1), $WLN_{g2}$(350), $WLN_{g3}$(700), $WLN_{g4}$(1050) based on the initial group number (N=4). The representative read voltages for the groups WLG1, WLG2, WLG3, and WLG4 may be derived as OSRV1, OSRV4, OSRV2, and OSRV2, respectively.

Referring to FIG. 8A, the performance determination circuit 230 may set at least one word line group WLG4 as the search group and set the remaining word line groups WLG1 to WLG3 as a standby group, according to the search direction, and determine whether or not the read performance value of the search group WLG4 is satisfied with the second threshold value TH2.

Referring to FIG. 8B, the group size adjustment circuit 240 may extend the group size while the read performance value of the search group WLG4 is satisfied with the second threshold value TH2.

As the size of the search group WLG4 is extended, the word line address corresponding to a boundary between the fourth group WLG4 as the search group and the standby group WLG1 to WLG3 may be changed from WLNg4(1050) to WLNg4,new(1000). As the size of the search group WLG4 is extended, the word line addresses included in the standby group WLG1 to WLG4_N may be adjusted as 1 to 1400.

When the read performance value of the search group WLG4 is satisfied with the second threshold value TH2, the group size adjustment circuit 240 may set the boundary word line address WLNg4 of the search group WLG4 to 1000, and then extend the size of the search group WLG4 again as shown in FIG. 8C.

As the size of the search group WLG4 is extended, the word line address corresponding to the boundary between the search group WLG4 and the standby group WLG1 to WLG3 may be changed from WLNg4(1000) to WLNg4, new(950). As the size of the search group WLG4 is extended, the word line addresses included in the standby group WLG1 to WLG3 may be adjusted as 1 to 950.

When the read performance value of the extended search group WLG4 is not satisfied with the second threshold value TH2, the group size adjustment circuit 240 may fix the size of the corresponding group according to just before word line address WLNg4=1000.

In another example, when the read performance value of the extended search group WLG4 is not satisfied with the second threshold value TH2, the group size adjustment circuit 240 may reduce the size of the search target group WLG4 so that the read performance value of the search target group WLG4 is satisfied with the second threshold value TH2.

Similarly, the group size adjustment circuit 240 may iterate the group size adjustment on the standby group WLG1 to WLG3.

In every iteration process, the following Equation 4 may be used to extend or reduce the size of the group according to the read performance value of the search group, but the embodiments are not limited thereto.

[Equation 4]

$$\bullet \text{For each iteration,}$$
$$\checkmark \text{ For } WLG4 \text{ (search target group)}$$
$$- \text{Employ the MAX } FBC \text{ or } RPR$$
$$- WLN \text{ set update: Select according to } TH2 \text{ satisfaction}$$
$$* \text{ Reward}^{(R)}: WLN_{g4,new} = WLN_{g4} \times a1,\ 0 < a1 < 1$$
$$* \text{ Penalty}^{(E)}: WLN_{g4,new} = WLN_{g4} \times a2 + WLN_{g4} \times b2$$
$$WLN_{g4,prep}: WLG \text{ boundary in prior iteration} \quad a2 + b2 = 1,\ 0 < a2, b2 < 1$$
$$\text{wherein } E \text{ is "extend", and } R \text{ is "reduce".}$$

Equation 4 is an example that the search direction is a direction that the word line address is reduced from an upper side to a lower side. When the search direction is reversely set, the extension/reduction equation may be reversely used.

Search convergence speed and an overall read performance value may be changed according to setting values of a1, a2, b1, and b2.

FIGS. 9A to 9D are diagrams for describing a group size adjustment concept according to a read performance value according to an embodiment of the present disclosure.

In the embodiment, the group size adjustment circuit 240 may classify the word lines of the memory block into two search groups WLGA and WLGB, determine whether or not the read performance values of the two search groups WLGA and WLGB are satisfied with the second threshold value TH2, and fix the group sizes when the read performance values of the two groups are satisfied with the second threshold value TH2.

When only the read performance value of one search group of the two search groups is satisfied with the second threshold value TH2 and simultaneously is satisfied with the third threshold value TH3, the group size adjustment circuit 240 may fix the size of the corresponding search group, divide the remaining search group into two search groups, and determine whether or not both the read performance values of the two divided search groups are satisfied with the second threshold value TH2.

When only the read performance value of one search group of the two divided search groups is satisfied with the second threshold value TH2 and is not satisfied with the third threshold value TH3, the group size adjustment circuit 240 may extend the size of the corresponding divided search group, and determine whether or not both the read performance values of the two divided search groups are satisfied with the second threshold value TH2.

When both read performance values of the two divided search groups are not satisfied with the second threshold value TH2, the group size adjustment circuit 240 may change the boundary between the two divided search groups according to a designated criterion and determine whether or not both the read performance values of the two divided search groups are satisfied with the second threshold values TH2.

Figure 9A:
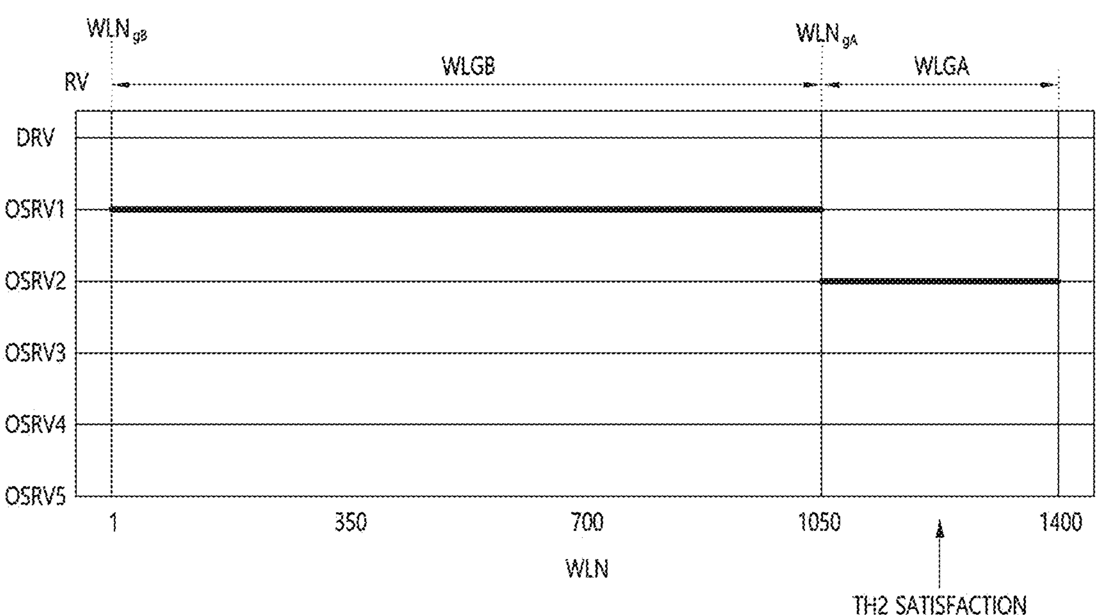
FIGS. 9A to 9D are diagrams for describing a group size adjustment concept according to a read performance value according to an embodiment of the present disclosure.

Referring to FIG. 9A, the group size adjustment circuit 240 may set the representative read voltages of the initial groups, and then classify the initial groups into a search group A WLGA and a search group B WLGB. A boundary word line address of the search group A may be $WLN_{gA}$, and a boundary word line address of the search group B may be $WLN_{gB}$.

Figure 9B:
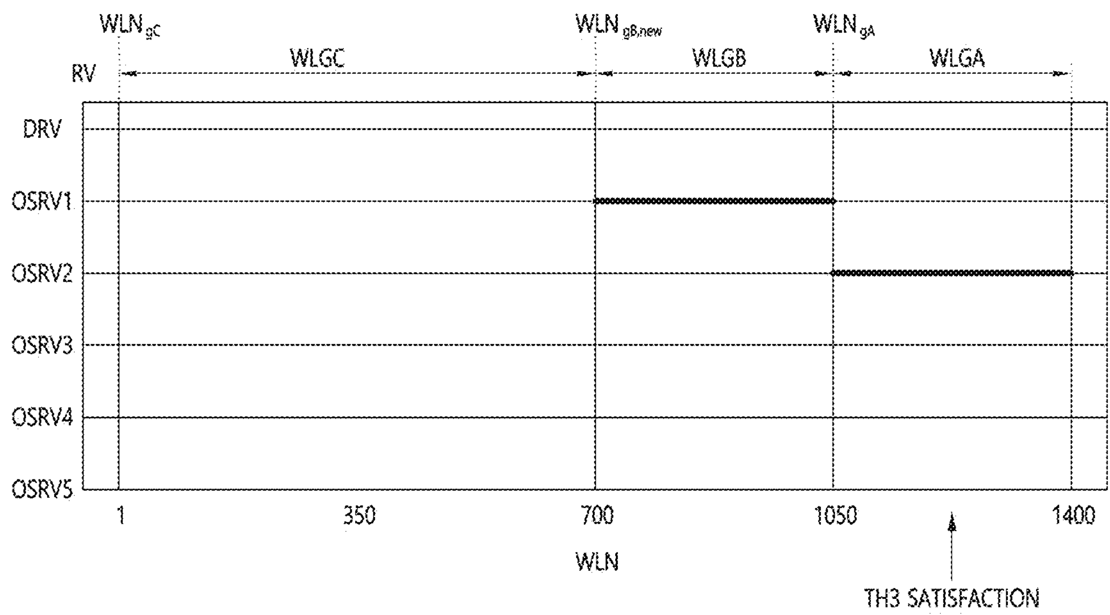

When the read performance value of the search group A WLGA is satisfied with the second threshold value TH2, the group size adjustment circuit 240 may determine whether or not the read performance value of the search group A WLGA is satisfied with the third threshold value TH3 as shown in FIG. 9B.

When the read performance value of the search group A WLGA is satisfied with the third threshold value TH3, the group size adjustment circuit 240 may fix the size of the search group A WLGA and classify the search group B WLGB into two search groups WLGB and WLGC. Here, a boundary word line address between the search group B WLGB and the search group C WLGC may be $WLN_{gB,new}$. Further, the group size adjustment circuit 240 may determine whether or not the read performance values of two search groups WLGB and WLGC are satisfied with the second threshold value TH2.

Figure 9C:
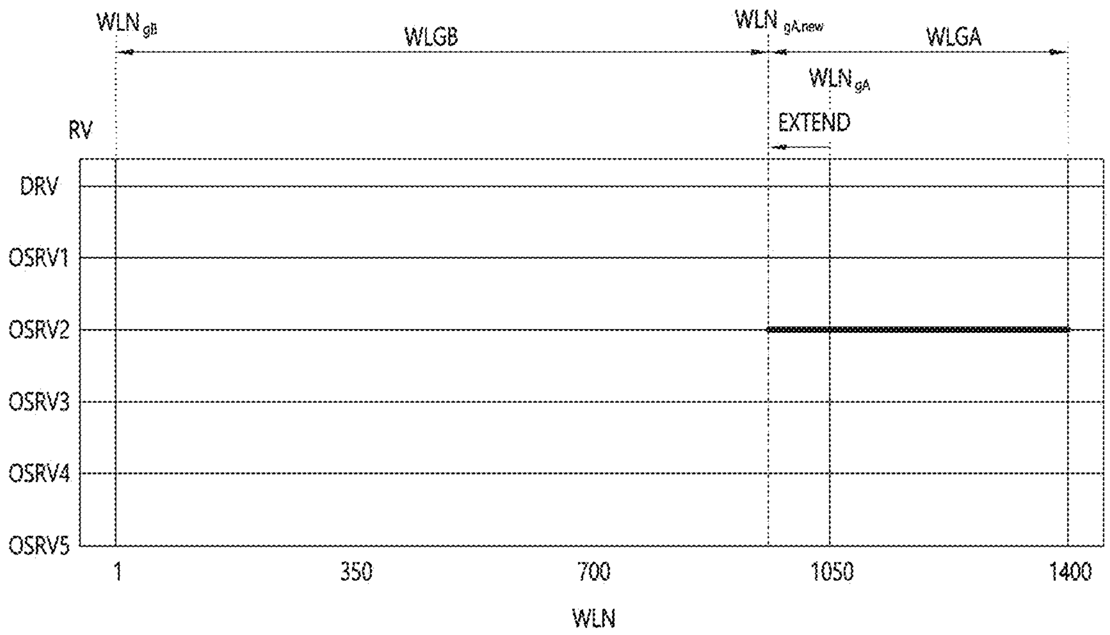

When the read performance value of the search group WLGA of FIG. 9A is not satisfied with the third threshold value TH3, the group size adjustment circuit 140 may extend the size of the search group WLGA as shown in FIG. 9C. Accordingly, the boundary word line address of the search group A WLGA may be changed to $WLN_{gA,new}$.

Subsequently, the group size adjustment circuit 240 may determine whether or not the read performance values of the extended search group A WLGA and the search group B WLGB are satisfied with the second threshold value TH2.

Figure 9D:
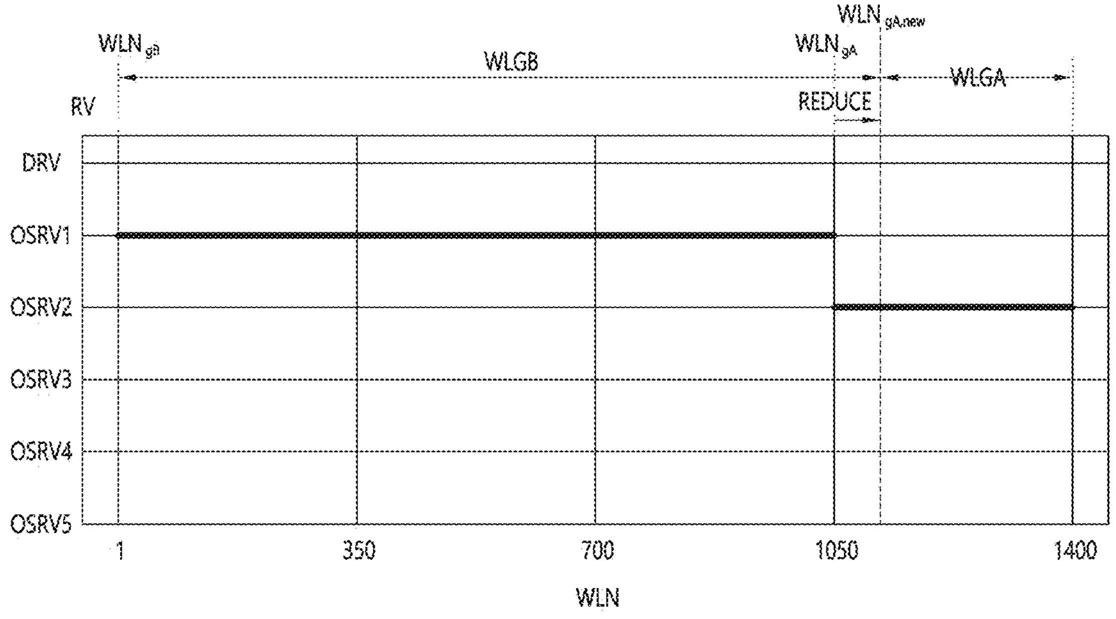

When both read performance values of the search group A WLGA and the search group B WLGB of FIG. 9A are not satisfied with the second threshold value TH2, the group size adjustment circuit 240 may reduce a size of one search group, for example, the size of the search group WLGA, and determine whether or not the read performance values of the two search groups WLGB and WLGC are satisfied with the second threshold value TH2, as shown in FIG. 9D.

FIG. 9D illustrates the example that the size of the search group WLGA is reduced and the boundary word line address of the search group WLGA is changed to $WLN_{gA,new}$.

In every iteration process, the following Equation 5 may be used to extend or reduce the size of the group according to whether or not the read performance values of two search groups are satisfied with the second threshold value TH2, but the embodiments are not limited thereto.

[Equation 5]

$$\bullet \text{For each iteration,}$$
$$\checkmark \text{ Employ the MAX } FBC \text{ or } RPR \text{ for } WLGA \text{ and } WLGB$$
$$\checkmark \text{ if both } WLGA \text{ and } WLGB \text{ satisfy } TH2 \text{ at the same time,}$$
$$\text{then stop: } WLG \text{ search termination (overall iteration termination)}$$
$$\checkmark \text{ else if only WLGA satisfies } TH2$$
$$\text{if } WLGA \text{ satisfies } TH3,$$
$$\text{then stop } WLGA \text{ update and divide}$$
$$WLGB: WLGA \text{ Search (extension) termination}$$
$$WLN_{gA,new} = WLN_{gA} \times a0,\ 0 < a0 \le a1$$
$$\#WLGs = \#WLGs + 1;\ \text{WLN\_new} = [\ WLN_{gA,new} \quad WLN_{gA}]$$
$$\text{else}$$
$$\text{Reward: } WLN_{gA,new} = WLN_{gA} \times a1,\ 0 < a1 < 1$$
$$\checkmark \text{ else:}$$

-continued $$\text{Penalty: } WLN_{gA,new} = WLN_{gA} \times a2 + WLN_{gA,new} \times b2 \quad \begin{matrix} a2 + b2 = 1, \\ 0 < a2, b2 < 1 \end{matrix}$$

Equation 5 is an example that the search direction is a direction that the word line address is reduced from an upper side to a lower side. When the search direction is reversely set, the extension/reduction equation may be reversely used.

Search convergence speed and an overall read performance value may be changed according to setting values of a1, a2, b1, and b2.

Figure 10:
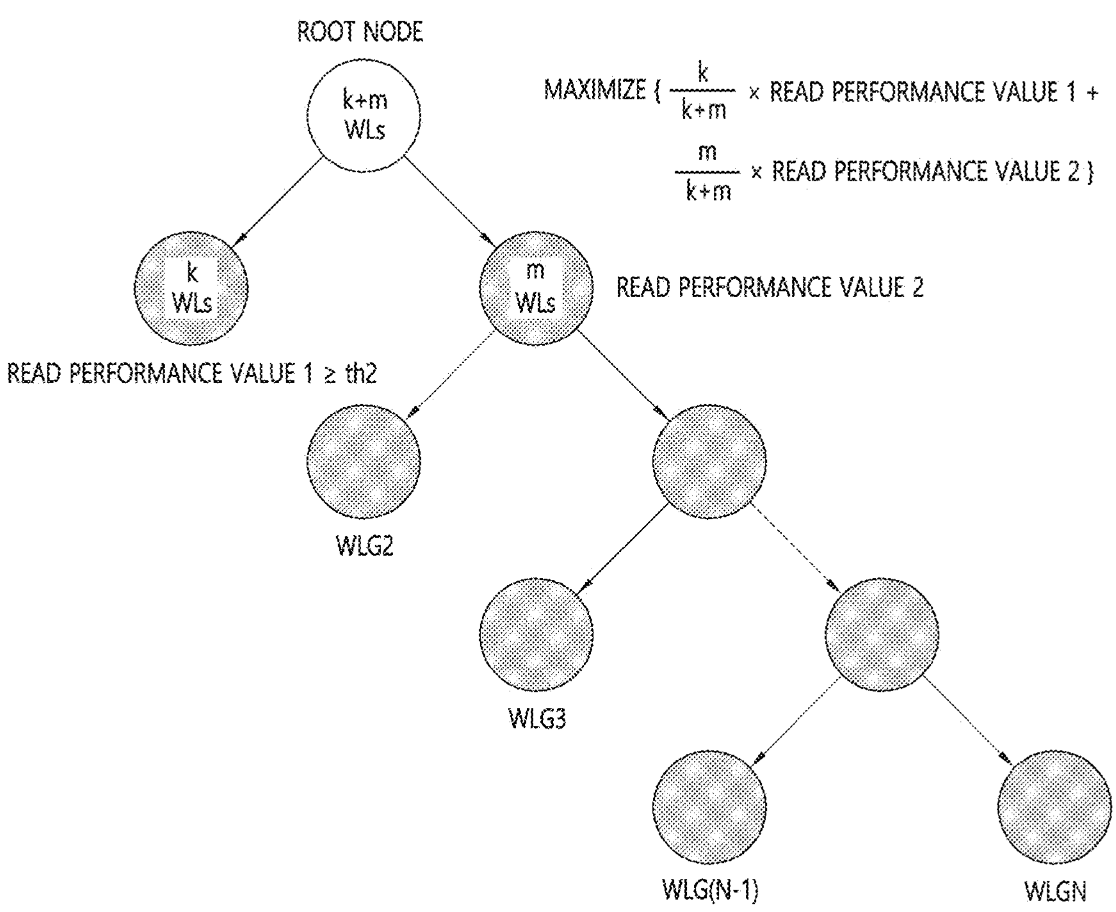
FIG. 10 is a diagram for describing a group size adjustment concept according to a read performance value according to an embodiment of the present disclosure.

FIG. 10 is a diagram for describing a group size adjustment concept according to a read performance value according to an embodiment of the present disclosure.

In the embodiment, the group size adjustment circuit 240 may classify the word line initial groups of the memory block into two search groups having the optimal read performance values in every search iteration process. For example, the group size adjustment circuit 240 may classify the word line initial groups into the two search groups having the optimal read performance values so that the read performance value of at least one search group of the two search groups is satisfied with the second threshold value TH2. Then, the group size adjustment circuit 240 may iterate the above-described search process for the search group, by which the read performance value is not satisfied with the second threshold value TH2.

Referring to FIG. 10, the group size adjustment circuit 240 may classify all word lines k+m WLs within the memory block into two search groups k WLs and m WLs. For example, the group size adjustment circuit 240 may classify the word lines k+m WLs so that overall read performance values is optimized and a read performance value 1 of one search group k WLs (WLG1) of the search groups k WLs and m WLs is satisfied with the second threshold value TH2. The size of the search groups k WLs (WLG1) by which the read performance value is satisfied with the second threshold value TH2 may be fixed.

The group size adjustment circuit 240 may divide the search group m WLs by which the read performance value is not satisfied with the second threshold value TH2 into two search groups again. For example, the group size adjustment circuit 240 may iterate a process of classifying the word lines so that the overall read performance value is optimized and a read performance value of one search group WLG2 is satisfied with the second threshold value TH2.

The group size adjustment concept according to the present embodiment may be a tree-based size adjustment method and a tree may be generated in a depth that the group number N to be grouped minus 1.

Figure 11:
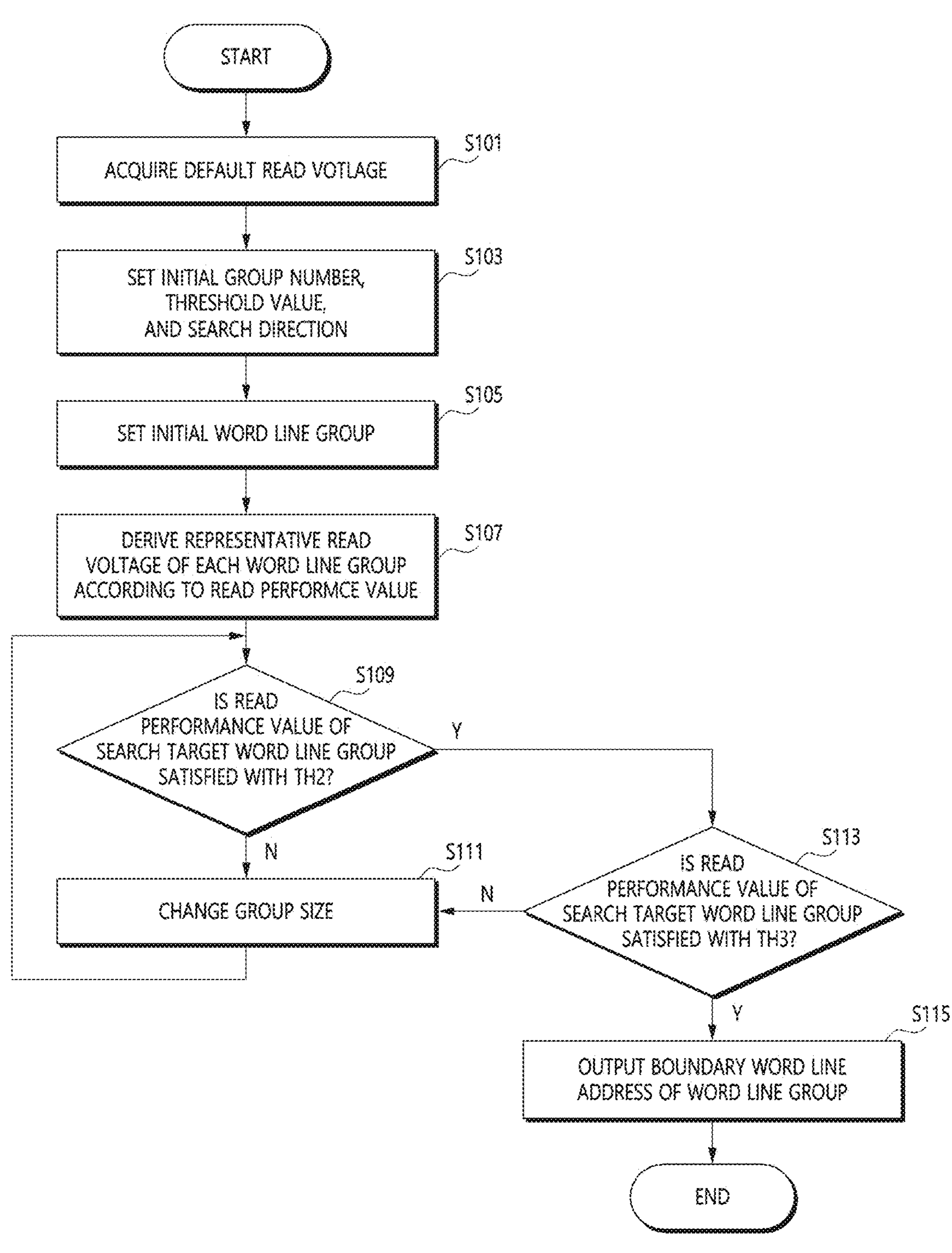
FIG. 11 is a flowchart for describing a method of grouping word lines in a memory device of a storage apparatus according to an embodiment of the present disclosure.

FIG. 11 is a flowchart for describing a word line grouping method according to an embodiment of the present disclosure.

Referring to FIG. 11, the word line grouping device 20 may acquire a default read voltage, which is threshold voltage distribution data for memory blocks included in the specification of the memory device 120, from the memory device 120 (at operation S101).

The word line grouping device 20 may set the initial group number N, the first threshold value TH1, the second threshold value TH2, the third threshold value TH3, and the search direction (at operation S103).

The initial group number N may be the initial group number of each memory block.

The first threshold value TH1 may be an error correction capability of the storage controller 110. The second threshold value TH2 may be a tolerance value for the read performance value of each group. The third threshold value may be a criterion value for terminating the group size adjustment and fixing the group size.

The search direction may be a selection direction of a search target group when adjusting the group size. Addresses may be assigned to the word lines of the memory block in an ascending order along a specific direction, and the group search direction may be selected from a direction that the word line address is increased or a direction that the word line address is reduced.

The word line grouping device 20 may perform initial grouping on the word lines of each memory block according to the initial group number N (at operation S105). In an embodiment, the initialization circuit 210 may divide the word lines included within the memory block by the initial group number N to generate the initial groups.

The word line grouping device 20 may determine (derive) the representative read voltage by which the read performance (e.g., at least one of MAX FBC and RPR) is optimized, based on the result read by using the plurality of candidate read voltages to the initial groups of the memory block, respectively (at operation S107).

In an embodiment, the candidate read voltage may include the default read voltage and the plurality of offset voltages by which the default read voltage is shifted by a certain amount.

In an embodiment, the read performance value may be determined as at least one of the maximum fail bit count (MAX FBC) and the read pass rate (RPR), and the representative read voltage may be determined from the candidate read voltage by which the maximum fail bit count (MAX FBC) is minimized and the candidate read voltage by which the read pass rate (RPR) is maximized.

The word line grouping device 20 may determine whether or not the read performance value obtained by reading the data of the word lines of each group by using the representative read voltage is satisfied with the second threshold value TH2 (at operation S109).

When the read performance value is not satisfied with the second threshold value (i.e., 'N' at the operation S109), the word line grouping device 20 may change a size of the corresponding group, for example, may reduce the group size (at operation S111). Further, the word line grouping device 20 may determine whether or not the read performance value of the size-changed group is satisfied with the second threshold value TH2 (at the operation S109). A fact that the read performance value of the group is satisfied with the second threshold value TH2 may mean that the read pass rate (RPR) obtained by reading the data stored in the corresponding group by using the representative read voltage is guaranteed above a certain level or that the maximum fail bit count (MAX FBC) is guaranteed below the certain level.

When the read performance value is satisfied with the second threshold value TH2 (i.e., 'Y' at the operation S109), the word line grouping device 20 may determine whether or not the read performance value of the corresponding group is satisfied with the third threshold value TH3 which is a group fixing criterion (at operation S113). The fact that the read performance value of the group is satisfied with the third threshold value TH3 may mean that the read performance value of the corresponding group is very close to the second threshold value TH2.

When the read performance value is satisfied with the third threshold value TH3 (i.e., 'Y' at the operation S113), the word line grouping device 20 may fix the size of the corresponding group and output the boundary word line address of the fixed group (at operation S115).

When the read performance value of the search target group is satisfied with the second threshold value TH2, but is not satisfied with the third threshold value TH3 (i.e., 'N' at the operation S113), for example, when the degree that the read performance value is satisfied with the second threshold value TH2 is larger than the third threshold value TH3, the word line grouping device 20 may change the size of the corresponding group, for example, extend the size of the corresponding group (at the operation S111). The word line grouping device 20 may determine whether or not the read performance value of the size-changed group is satisfied with the second threshold value TH2 (at the operation S109).

The word line grouping device 20 may add or delete the word line physically adjacent to the corresponding group to change the group size.

When the read performance value of the extended group is not satisfied with the second threshold value TH2 in operation S109 after the group size is fixed, the word line grouping device 20 may fix the group just before extension as the final group.

The word line grouping device 20 may terminate the group size adjustment and fix the group when the read performance values of all groups are satisfied with the second threshold value TH2.

The maximum value or the minimum value of the word line addresses included in each fixed group may be output a separator of each group.

Accordingly, the word line grouping device 20 may group the plurality of word lines included in the memory block so that data of the word lines are read by using the representative read voltage.

The above described embodiments of the present disclosure are intended to illustrate and not to limit the embodiments of the present disclosure. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims. Furthermore, the embodiments may be combined to form additional embodiments.

What is claimed is:

1. A storage apparatus comprising:

a memory device including a plurality of word lines; and a word line grouping device configured to group the plurality of word lines into a certain number of groups, so that a read performance value, obtained by reading data of word lines included in a same group by using a representative read voltage, is satisfied with a set tolerance value, wherein the read performance value includes a read pass rate which is a ratio of a word line number having a fail bit count within error correction capability to a total word line number of each group for a plurality of candidate read voltages when data of the word lines in each group are read by using at least a portion of the plurality of candidate read voltages.

2. The storage apparatus of claim 1, wherein the word line grouping device includes:

a representative read voltage decision circuit configured to determine the representative read voltage of each group, by which the read performance value is optimized; and a group size adjustment circuit configured to adjust a size of each group so that the read performance value of each group is satisfied with the set tolerance value.

3. The storage apparatus of claim 1, wherein the word line grouping device is configured to determine, as the representative read voltage, a candidate read voltage which maximizes the read pass rate.

4. The storage apparatus of claim 1, wherein the word line grouping device is configured to fix a size of a first group of the groups when a read performance value of the first group is satisfied with the set tolerance value and the read performance value of the first group is satisfied with a criterion value which is set to terminate group size adjustment.

5. The storage apparatus of claim 1, wherein the word line grouping device is configured to extend a size of a second group of the groups when a read performance value of a second group is satisfied with the set tolerance value and a read performance value of the second group is not satisfied with a criterion value which is set to terminate group size adjustment.

6. The storage apparatus of claim 1, wherein the word line grouping device is configured to reduce a size of a third group of the groups when a read performance value of the third group is not satisfied with the set tolerance value.

7. The storage apparatus of claim 1, wherein the word line grouping device is configured to fix sizes of all groups when read performance values of all groups are satisfied with the set tolerance value.

8. An operating method of a storage apparatus which includes a memory device including a plurality of word lines; and a storage controller configured to control the memory device, the method comprising:

the storage controller grouping a plurality of word lines into a certain number of groups; and the storage controller regrouping the plurality of word lines so that a read performance value obtained by reading data of word lines included in a same group by using a representative read voltage, is satisfied with a set tolerance value, wherein the read performance value is determined to include a read pass rate which is a ratio of a word line number having a fail bit count within error correction capability to a total word line number in each group for a plurality of candidate read voltages when data of the word lines in each group are read by using at least a portion of the plurality of candidate read voltages.

9. The method of claim 8, further comprising determining the representative read voltage by which the read performance value of each group is optimized, wherein the regrouping of the plurality of word lines includes adjusting a size of each group so that the read performance value of the group is satisfied with the set tolerance value when the data of the word lines included in the same group are read by using the representative read voltage.

10. The method of claim 8, further comprising determining a candidate read voltage which maximizes the read pass rate as the representative read voltage.

11. The method of claim 8, further comprising fixing a size of a first group of the groups when a read performance value of the first group is satisfied with the set tolerance value and the read performance value of the first group is satisfied with a criterion value which is set to terminate group size adjustment.

12. The method of claim 8, further comprising extending a size of a second group of the groups when a read performance value of a second group is satisfied with the set tolerance value and a read performance value of the second group is not satisfied with a criterion value which is set to terminate group size adjustment.

13. The method of claim 8, further comprising reducing a size of a third group of the groups when a read performance value of the third group is not satisfied with the set tolerance value.

14. The method of claim 8, further comprising fixing sizes of all groups when read performance values of all groups are satisfied with the set tolerance value.

* * * * *